United States Patent
Fischer et al.

(10) Patent No.: US 12,332,311 B2
(45) Date of Patent: Jun. 17, 2025

(54) OUTPUT MODULE AND METHOD FOR OPERATING THE MODULE

(71) Applicant: Siemens Aktiengesellschaft, Munich (DE)

(72) Inventors: Peter Fischer, Schwandorf (DE); Fabian Dehling, Edelsfeld (DE)

(73) Assignee: Siemens Aktiengesellschaft, Munich (DE)

( * ) Notice: Subject to any disclaimer, the term of this patent is extended or adjusted under 35 U.S.C. 154(b) by 207 days.

(21) Appl. No.: 18/039,382

(22) PCT Filed: Oct. 28, 2021

(86) PCT No.: PCT/EP2021/079914
§ 371 (c)(1),
(2) Date: May 30, 2023

(87) PCT Pub. No.: WO2022/117266
PCT Pub. Date: Jun. 9, 2022

(65) Prior Publication Data
US 2023/0417833 A1  Dec. 28, 2023

(30) Foreign Application Priority Data
Dec. 1, 2020  (EP) ..................................... 20210889

(51) Int. Cl.
*G01R 31/327* (2006.01)
*H01H 47/00* (2006.01)
(Continued)

(52) U.S. Cl.
CPC ....... *G01R 31/3277* (2013.01); *H01H 47/002* (2013.01); *H01H 50/18* (2013.01); *H01H 50/44* (2013.01)

(58) Field of Classification Search
CPC .. G01R 31/3277; H01H 47/002; H01H 50/18; H01H 50/44; G05B 19/0428
See application file for complete search history.

(56) References Cited

U.S. PATENT DOCUMENTS

| | | | |
|---|---|---|---|
| 7,012,800 B2 * | 3/2006 | Busch | H01H 89/06 361/628 |
| 2007/0109704 A1 * | 5/2007 | Apfelbacher | H01H 85/0241 361/93.1 |

(Continued)

FOREIGN PATENT DOCUMENTS

| | | |
|---|---|---|
| DE | 102010036941 | 2/2012 |
| EP | 2549843 | 1/2013 |

(Continued)

OTHER PUBLICATIONS

PCT International Search Report dated Nov. 2, 2022 based on PCT/EP2021/079914 filed Oct. 28, 2021.

*Primary Examiner* — Jermele M Hollington
*Assistant Examiner* — Zannatul Ferdous
(74) *Attorney, Agent, or Firm* — Cozen O'Connor

(57) ABSTRACT

An output module includes an output for switching a load and includes a switch that switches a switching voltage to the output to cause a load current to flow, wherein the module includes a measuring device that provides a monitoring signal profile that maps a signal profile of the load current based on the switching voltage, an analyzer that compares, at least at points, the monitoring signal profile with a switch-on characteristic curve characterizing the load, and a diagnostic device that generates a maintenance notification when the comparison exceeds a specifiable deviation.

15 Claims, 4 Drawing Sheets

(51) Int. Cl.
*H01H 50/18* (2006.01)
*H01H 50/44* (2006.01)

(56) References Cited

U.S. PATENT DOCUMENTS

| | | |
|---|---|---|
| 2013/0169287 A1 | 7/2013 | Fink et al. |
| 2013/0175336 A1 | 7/2013 | Fischer |
| 2015/0318777 A1* | 11/2015 | Pasqua .................... H02M 1/08 |
| | | 363/21.13 |
| 2021/0044288 A1* | 2/2021 | Troyer ................... H02H 9/001 |

FOREIGN PATENT DOCUMENTS

| | | |
|---|---|---|
| JP | 2011186518 | 9/2011 |
| KR | 20150074653 | 7/2015 |
| WO | 2009103584 | 8/2009 |

\* cited by examiner

OUTPUT MODULE AND METHOD FOR OPERATING THE MODULE

CROSS-REFERENCE TO RELATED APPLICATIONS

This is a U.S. national stage of application No. PCT/EP2021/079914 filed 28 Oct. 2021. Priority is claimed on European Application No. 20210889.0 filed 1 Dec. 2020, the content of which is incorporated herein by reference in its entirety.

BACKGROUND OF THE INVENTION

1. Field of the Invention

The invention relates to a method and an output module having an output for switching a load, comprising a switch which switches a switching voltage to the output and thereby causes a load current to flow.

2. Description of the Related Art

EP 2 549 843 A1 discloses conventional output modules. Output modules are in particular required in industrial automation technology or control technology, for example, for switching actuators, relays or solenoid valves.

In the case of the output module of EP 2 549 843 A1, a method is presented in which a connector that has been plugged in once can be reliably reassigned to an output module.

Such known digital output modules in, for example, programmable logic controllers for, for example, actuating electromagnetic loads or inductive loads, resistive or capacitive loads only monitor an output signal for a set static value regarding short circuits/overloads and/or wire breaks. If a limit value is exceeded, then the module sends a diagnostic signal to a higher-level system.

KR 2015 0074653 A and JP 2011 186518 A disclose output modules that are capable of inferring wear based on the signal profile of the load current through a coil. This identifies a change in the signal profile caused by wear or contamination when the consumer is switched. This enables the generation of a possible maintenance notification, which in turn does not result in failures of the plant and hence does not cause high costs.

SUMMARY OF THE INVENTION

It is an object of the invention to improve the conventional output modules in a way that enables premature wear of loads to be switched to be identified.

This and other objects and advantages are achieved in accordance with the invention by an output module provided with a measuring device that is configured to provide a monitoring signal profile that maps a signal profile of the load current based on the switching voltage and that has an analyzer that is configured to compare, at least at points, the monitoring signal profile with a switch-on characteristic curve characterizing the load and that also has a diagnostic device that is configured to generate a maintenance notification if the comparison exceeds a specifiable deviation.

For fast and effective analysis, the output module has a detector that is configured, on the first or initial startup of the load, to detect an initial state and thus an individual switch-on characteristic curve of the load over a predetermined detection period at a predetermined sampling rate, where the detector is additionally configured, for the point-by-point comparison, to ascertain and store value pairs from the individual switch-on characteristic curve at which a gradient changes sign or is equal to zero in the course of the individual switch-on characteristic curve, where the value pairs have an amplitude and a point in time, the measuring device is then configured likewise to provide the monitoring signal profile in the predetermined detection period at the predetermined sampling rate. The the analyzer is further configured, for the point-by-point comparison, to ascertain value pairs at which a gradient likewise changes time or is equal to zero in the course of the monitoring signal profile, and the analyzer is further configured to examine the value pairs with the current value pairs with regard to a shift in their point in time and to generate the maintenance notification if a specifiable deviation is exceeded.

Advantageously, a currently recorded monitoring signal profile, for example, of an electromagnetic switch (contactor), can now be compared with a nominal profile of a characteristic curve, for example, for a brand-new contactor. If deviations occur between the currently recorded monitoring signal profile and the signal profile of a new actuator, then it can be inferred therefrom that the load to be switched has aged or will soon have to be replaced.

A further improvement to the output module provides that the analyzer is configured to ascertain a level of a supply voltage of the output module and, when comparing the monitoring signal profile with the switch-on characteristic curve, to take account of the level of the supply voltage such that, in the event of fluctuations in the supply voltage, which likewise affect the switching voltage and thus the monitoring signal profile, no erroneously generated maintenance notification occurs.

The amplitude values of the monitoring signal profile or the output switching voltage also change in dependence on the level of the supply voltage. In the case of a comparison, these changes could in turn lead to erroneous information or a mistaken maintenance notification. With currently known output modules, the supply voltage can range between 20.4 V and 28.8 V with reliable operation still being ensured. However, this large fluctuation in the supply voltage also means that the switching voltage for the corresponding load to be switched is likewise subject to these fluctuations. In order to be able to differentiate between a change due, for example, to mechanical wear or a change in the supply voltage, the amplitude of the supply voltage is included in an analysis of the monitoring signal profile.

In order to optimize the memory requirement to be used for a comparison between an original switch-on characteristic curve and the subsequent recorded monitoring signal profiles, only the amplitude values, relative to the time axis, at which the gradient of the signal profile significantly changes are buffered.

In addition to the advantage of the saving memory space, this point-by-point comparison with value pairs can be programmed much more quickly and efficiently in an algorithm, thus rendering the evaluation of the signal profiles more powerful.

Another advantage is that the comparison of the value pairs has enabled the influence of the level of the supply voltage to be taken into account, because, as a rule, the supply voltage has the effect that the amplitude values of the signal profile are, as a rule, increased by a certain amount. This means that the significant points in the signal profile at which the gradient changes, i.e., where extreme values occur in the signal profile, are at the same point in time when there is non-significant wear. Hence, the influence of the supply voltage can be taken into account without a maintenance notification being sent erroneously.

This point-by-point comparison of the signal profile can in particular be applied with inductive loads for electromechanical actuators. The analyzer is then configured, in relation to a inductive load of an electromechanical actuator with a coil and an armature, to ascertain the following values in the monitoring signal profile, starting from a starting point in time at which energization of the coil begins, a first comparison value is ascertained when a first point in time is reached at which the armature moves, a second comparison value is ascertained when a second point in time is reached at which the armature reaches an end position and a third comparison value is ascertained when a third point in time is reached at which magnetic saturation is reached. These ascertained comparison values form, for example, a "three-point profile" characterizing a signal profile that is sufficient with respect to generating a maintenance notification, in particular for constructive loads. Four or more points can also be used for other types of loads.

Furthermore, the analyzer is configured to ascertain a duration between the first point in time and the second point in time and evaluate this as a wear criterion and to generate a maintenance notification if the duration exceeds a specified duration.

Advantageously, the output module has a buffer memory configured to store monitoring signal profiles and forward them to a higher-level system. The ascertaining of the three comparison points is used as the basis for detecting the so-called three-point profile, which is likewise buffered and later forwarded to a higher-level system, which can then read out the characteristic signal from the three-point profile of the monitoring signal profile. This approach enables the amount of data to be stored and transmitted to be greatly reduced. If enough memory and computing capacity are available, then the complete signal profile and/or the three-point profile can be transmitted.

Particularly with regard to modern contactors configured with PWM actuation for power reduction, it is advantageous for the module to have a filter configured to calculate a smoothed signal profile if the monitoring signal profile is present as a pulsed signal profile.

The objects in accordance with the invention are likewise achieved by a method for operating an output module, where a switch switches a switching voltage to an output for switching a load and thereby causes a load current to flow. In accordance with the method of the invention, a monitoring signal profile is ascertained that maps a signal profile of the load current based on the switching voltage, the monitoring signal profile is analyzed such that it is compared, at least at points, with a switch-on characteristic curve characterizing the load, and a diagnostic device is operated to generate a maintenance notification if the comparison exceeds a specifiable deviation. If, for example, a relay is in a new state and its switch-on characteristic profile is detected, in a comparison, this is then approximately the switch-on characteristic profile of a brand-new relay. However, if a monitoring signal profile is, for example, to be recorded after 3 million switching cycles of the relay, then it is possible to read profile delays or changed amplitude values in the monitoring signal that indicate ageing or wear of the relay. On the first or initial startup of the load, a detector can detect an initial state and thus an individual switch-on characteristic curve of the load over a predetermined detection period at a predetermined sampling rate. Furthermore, for the point-by-point comparison, value pairs are ascertained from the individual switch-on characteristic curve at which a gradient changes sign or is equal to zero over the course of the individual switch-on characteristic curve and stored, where the value pairs have an amplitude and a point in time. The measuring device then likewise provides the monitoring signal profile in the predetermined detection period at the predetermined sampling rate. In addition, for the point-by-point comparison, current value pairs at which a gradient likewise changes sign or is equal to zero in the course of the monitoring signal profile are ascertained from the monitoring signal profile, the value pairs from the individual switch-on characteristic curve are compared with the current value pairs with regard to a shift in their point in time and, if a specified deviation is exceeded, the maintenance notification is generated.

Conventional modules cannot identify a change to the signal profile due to wear or contamination when a consumer is switched. Accordingly, no possible maintenance notification is generated and this can in turn lead to failures of industrial plants. In contrast, the method in accordance with the invention now represents a method of operating an output module that leads to the early output of a maintenance notification in the event of impending wear or contamination.

For this purpose, an analyzer is operated that is capable of ascertaining a level of a supply voltage of the output module and, when comparing the monitoring signal profile with the switch-on characteristic curve, to take account of the level of the supply voltage such that, in the event of fluctuations in the supply voltage, which likewise affect the switching voltage and thus the monitoring signal profile, no erroneously generated maintenance notification occurs.

Conventional output modules, in particular for industrial automation, have a supply voltage range of, for example, 20.4 to 28.8 volts and the supply voltage may vary in different plants.

This approach can in particular enable an influence of a supply voltage to be easily ascertained or removed such that no maintenance notifications are sent erroneously. This is because, with an intact contactor, the amplitude value of extreme values in the one and the other signal profile only differ in the level and the point in time of the extreme values remains the same. Additionally, if the extreme value has not shifted to other points in time, then it can be assumed that there is no wear on the components and only the supply voltage was affected.

In particular in relation to an inductive load of an electromagnetic actuator with a coil and an armature, it has proved to be advantageous to ascertain the following values in the monitoring signal profile, starting from a starting point in time, at which energization of the coil begins, a first comparison value is ascertained when a first point in time is reached at which the armature moves, a second comparison value is ascertained when a second point in time is reached at which the armature reaches an end position and a third comparison value is ascertained when a third point in time is reached at which magnetic saturation is reached.

In addition, a duration between the first point in time and the second point in time can be ascertained and evaluated as a wear criterion, and a maintenance notification is generated if the duration exceeds a specifiable duration.

With regard to preventive maintenance of an entire plant, the monitoring signal profiles are buffered on the output module and routed to a higher-level system. In order to save storage space, it is also possible only to store the comparison values as a three-point profile.

Maintenance data is provided to a plant operator for early detection.

The output module in accordance with the invention with its analyzer for analyzing the recorded monitoring signal profile can also be used to record an analysis of the supply voltage, to record and analyze the output currents from a plurality of channels in a multi-channel output module. An analysis of the load could also relate to speed in relation to a DC motor. A current measurement could also be included in the analysis, for example, in the event of resistive consumers. This could, for example, enable corroded terminals to be detected. The analysis includes the identification of blocked electromechanical contactors or solenoid valves.

Within the context of the invention, pulsed voltage is to be understood as pulse width modulation (PWM) actuation. PWM actuation is commonly used nowadays. Many control devices already implement PWM routines. PWM can also be used to reduce the coil power in the event of relay coils and thus prevent the relay from heating up.

Within the context of the invention, it is provided that signal profiles or signal patterns that indicate damage, wear or faults in advance are analyzed and that maintenance notifications are generated therefrom.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The drawing shows an exemplary embodiment of the invention, in which.

DETAILED DESCRIPTION OF THE EXEMPLARY EMBODIMENTS

Figure 1:
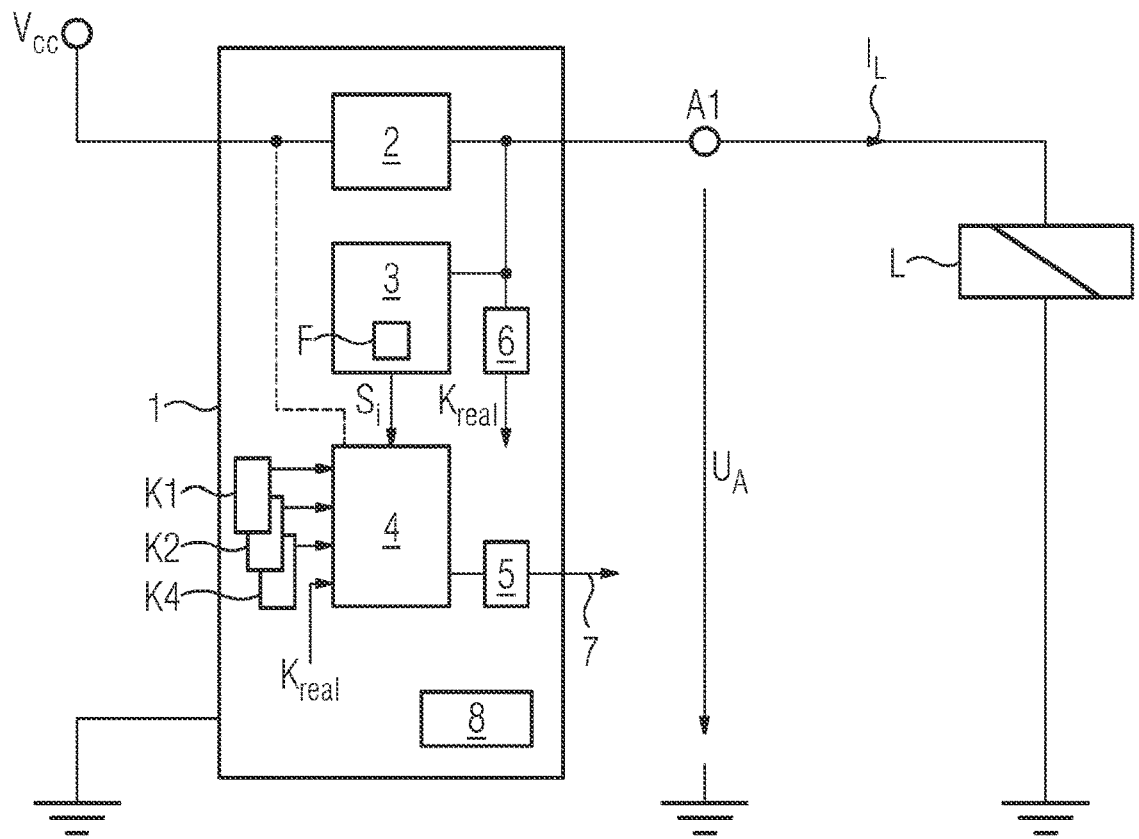
FIG. 1 is a schematic illustration of an output module for switching a load in accordance with the invention.

FIG. 1 depicts an output module having an output A1 for switching a load L. The output module comprises a switch 2 that switches a switching voltage UA to the output A1 and thereby causes a load current $I_L$ to flow through the load L. Such output modules are, for example, used in industrial automation technology for switching relays or solenoid valves.

A measuring device 3 in the output module 1 is configured to record a monitoring signal profile $S_i$ that maps a signal profile of the load current $I_L$ through the load L based on the switching voltage $U_A$. This recording could, for example, be performed as follows. When the output A1 is activated, the signal is sampled via an A/D converter via a current mirror. Herein, the signal profile is detected with a predefined sampling frequency over a predetermined time t and made available to the output module 1 or an analyzer 4 for further processing/analysis.

The analyzer 4 is configured to compare, at least at points, the monitoring signal profile $S_i$ with a switch-on characteristic curve K1 characterizing the load L.

The comparison values are fed to a diagnostic device 5, which is configured to generate a maintenance notification if the comparison exceeds a specifiable deviation.

The analyzer 4 receives the monitoring signal profile $S_i$ of the respective recorded current of the load L as an input variable and different switch-on characteristics, i.e., a first switch-on characteristic curve K1, a second switch-on characteristic curve K2 and a third switch-on characteristic curve K3 for different loads and/or supply voltage $V_{cc}$, as a further monitoring variable. The output module 1 is also configured to detect an initial state and thus an individual switch-on characteristic curve $K_{real}$ of the load L on the first startup of the load L. This individual switch-on characteristic curve $K_{real}$ is also made available to the analyzer 4 as an input variable.

With regard to a relay to be switched with integrated PWM actuation, the output module 1 has, preferably in the measuring device 3, a filter F. The filter F is used to calculate a smoothed signal profile if the monitoring signal profile $S_i$ is to be present as a pulsed signal profile.

The output module 1 in FIG. 1 is in particular configured to ascertain comparison values in the recorded monitoring signal profile $S_i$ with respect to an inductive load L of an electromechanical actuator with a coil and an armature. For an explanation of the values to be ascertained, reference is made to FIG. 2.

Figure 2:
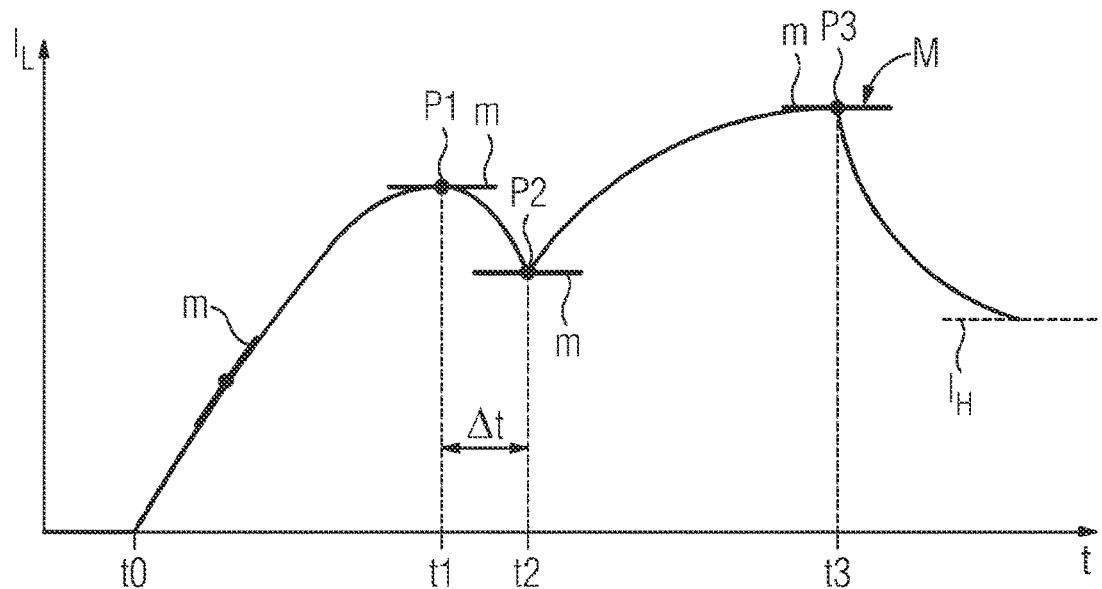
FIG. 2 is a graphical plots of a typical current profile of an inductive load.

FIG. 2 shows a typical current profile of an inductive load L to be switched. Starting from a starting point in time t0 at which energization of the coil begins, a first comparison value P1 is ascertained when a first point in time t1 is reached at which the armature moves, a second comparison value P2 is ascertained when a second point in time t2 is reached at which the armature reaches an end position and a third comparison value P3 is ascertained when a third point in time t3 is reached at which magnetic saturation is reached. After the third comparison value t3 is reached, the signal profile of the load current $I_L$ drops and is led into a holding current range $I_H$. The analyzer 4 of the output module 1 is configured, for the point-by-point comparison, to ascertain the comparison values P1, P2, P3 at the points at which a gradient m changes sign or is equal to zero in the monitoring signal profile $S_i$. The analyzer 4 of the output module 1 is also configured to ascertain a duration $\Delta t$ between the first point in time t1 and the second point in time t2 and evaluate it as a wear criterion and to generate a maintenance notification 7 if the duration $\Delta t$ exceeds a specifiable duration $t_{neu}$. As, for example, a switching relay or contactor ages, the time $\Delta t$ will continue to increase.

Figure 3:
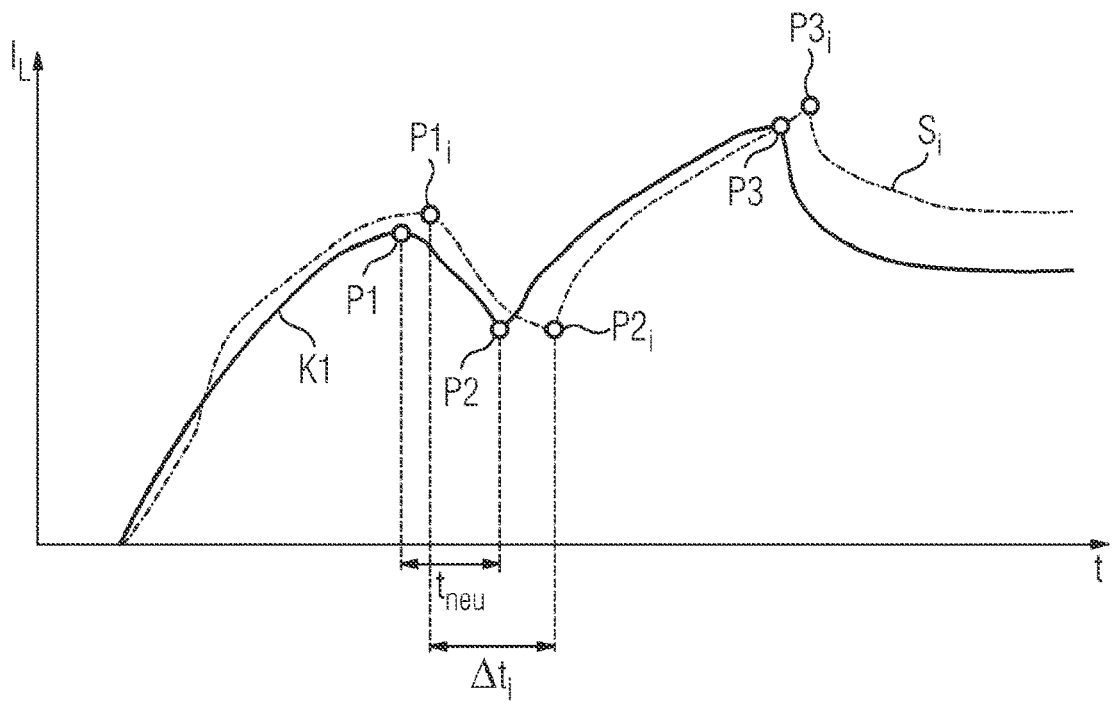
FIG. 3 is a graphical plot of a characteristic profile with a recorded monitoring signal profile for comparison with a switch-on characteristic curve.

FIG. 3 shows a graphical plot of the comparison of a switch-on characteristic curve K1 with a currently recorded monitoring signal profile $S_i$. The comparison values P1, P2, P3 are compared with the corresponding comparison values P1$i$, P2$i$, P3$i$ of the corresponding monitoring signal profile $S_i$. The shift or increase in the duration $\Delta t$ between the first point in time t1 and the second point in time t2 is also ascertained and analyzed.

Figure 4:
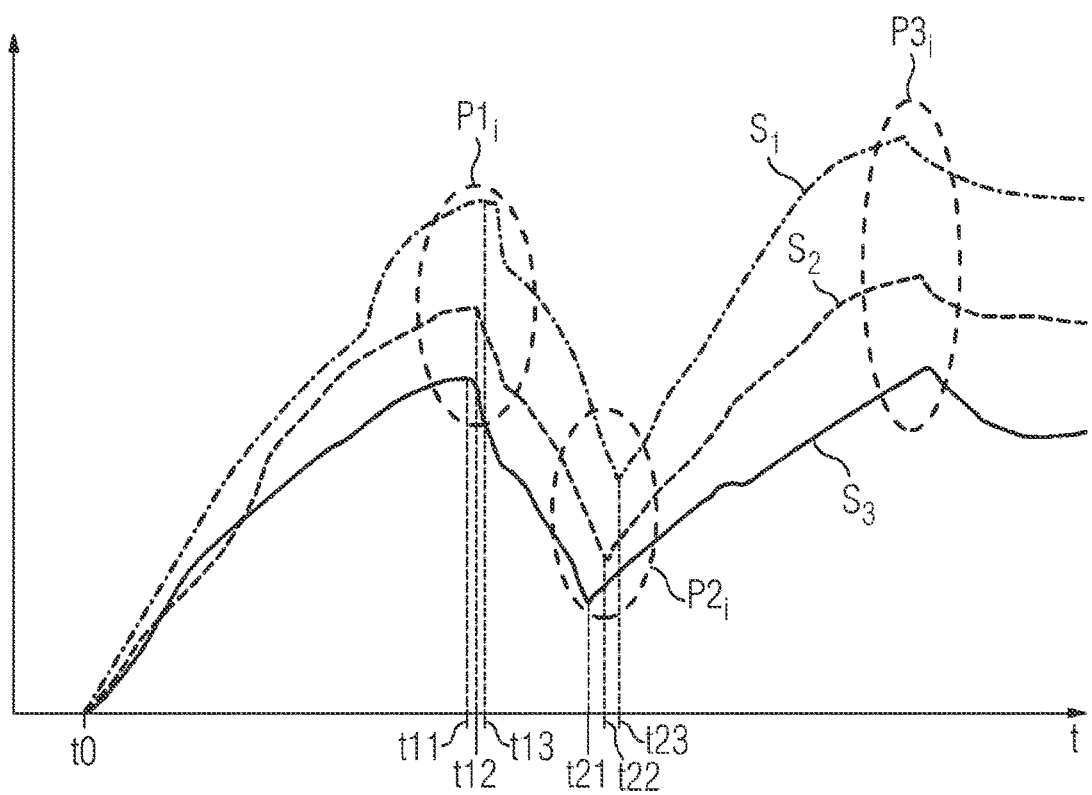
FIG. 4 is a graphical plot of a signal profile for elucidating the effects of the switching voltage on the monitoring signal profiles.

FIG. 4 shows graphical plots of different monitoring signal profiles at different supply voltages $V_{cc}$. A first monitoring signal profile $S_i$ has been recorded at a first supply voltage V1, a second monitoring signal profile $S_2$ has been recorded at a second supply voltage V2 and a third monitoring signal profile $S_3$ has been recorded at a third supply voltage V3. The analysis means 4 of the module 1 is now configured to ascertain a level of the supply voltage $V_{cc}$ of the output module 1 and, in a comparison of the monitoring signal profiles $S_1$, $S_2$, $S_3$ with a respective switch-on characteristic curve K1$i$ representing the level of the corresponding supply voltage, to compare it and take it into account such that, in the event of fluctuations in the supply voltage $V_{cc}$, which likewise affect the switching voltage $U_A$ and thus the monitoring signal profile $S_i$, no erroneously generated maintenance notification 7 occurs.

With regard to saving memory space, in particular on the module, only a "three-point profile" is noted for each signal profile. The dashed lines show a range for the detection of first, second and third comparison values $P1_i$, $P2_i$ and $P3_i$.

In FIG. 4, the amplitude extreme values of the signal profiles S1, S2, S3 are each assigned a first point in time t11, t12, t13 and a second point in time t21, t22, t23. This makes it evident that an influence of the supply voltage $V_{cc}$ on the signal profiles S1, S2, S3, has a significant effect on the amplitude value, but not on the associated time value.

Figure 5:
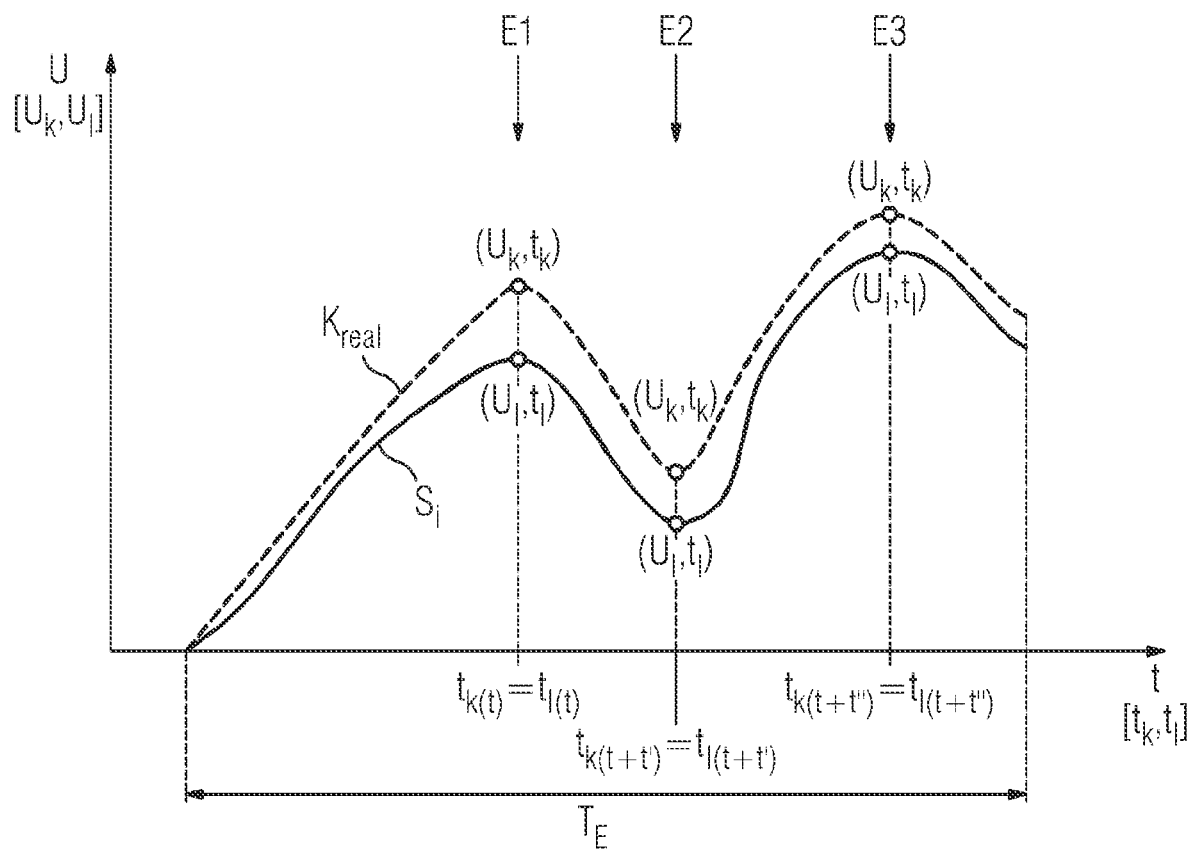
FIG. 5 is a graphical plot of signal profiles for two different supply voltages.

FIG. 5 is intended to elucidate how to analyze extreme values E1, E2, E3, from the signal profiles and to use the value pairs $U_K$, $t_K$ or $U_L$, $t_L$ associated with the extreme values E1, E2, E3 to state whether or not wear is present. The signal profile is detected over the time t in a predetermined detection period $T_E$ at a predetermined sampling rate. For the later point-by-point comparison of the value pairs, a value pair $U_K$, $t_K$ associated with the extreme value E1, E2, E3 is ascertained in each case from the individual switch-on characteristic curve $K_{real}$ and stored. To find an extreme value E1, E2, E3 over the course of the individual switch-on characteristic curve $K_{real}$, the gradient m of the signal profile is examined.

The value pairs $U_K$, $t_K$ each have an amplitude $U_K$ and a point in time $t_K$ at the extreme values E1, E2, E3.

The measuring device 3 then likewise provides the monitoring signal profile $S_i$ in the predetermined detection period $T_E$ at the predetermined sampling rate. For the later point-by-point comparison, current value pairs $U_L$, $t_L$ are ascertained from the monitoring signal profile $S_i$ at which a gradient m likewise changes sign or is equal to zero in the course of the monitoring signal profile $S_i$. The value pairs $U_K$, $t_K$ from the individual switch-on characteristic curve $K_{real}$ are compared with the current value pairs $U_L$, $t_L$ with regard to a shift in their point in time and, if a specifiable deviation is exceeded, the maintenance notification 7 is generated.

The two signal profiles in FIG. 5 only differ in their maximum amplitude values; for example, at a first extreme value E1 at a point in time $t_{K(t)} = t_{L(t)}$, only the respective amplitudes $U_K$, $U_L$ differ and likewise, at a second extreme value E2 at the point in time $t_K (t+t') = t_L (t+t_1')$, only the amplitude $U_K$, $U_L$ differs and likewise, at a third extreme value E3 at a point in time $t_K (t+t'') = t_L (t+t'')$, only the respective amplitude $U_K$, $U_L$ differs. Since now the respective points in time correspond to the respective extreme values E1, E2, E3 in the value pairs $U_K$, $t_K$ or $U_L$, $t_L$, it can be clearly stated that there is no ageing or wear here, it is only an influence of the supply voltage VCC that has shifted the amplitude values $U_K$, $U_L$.

Figure 6:
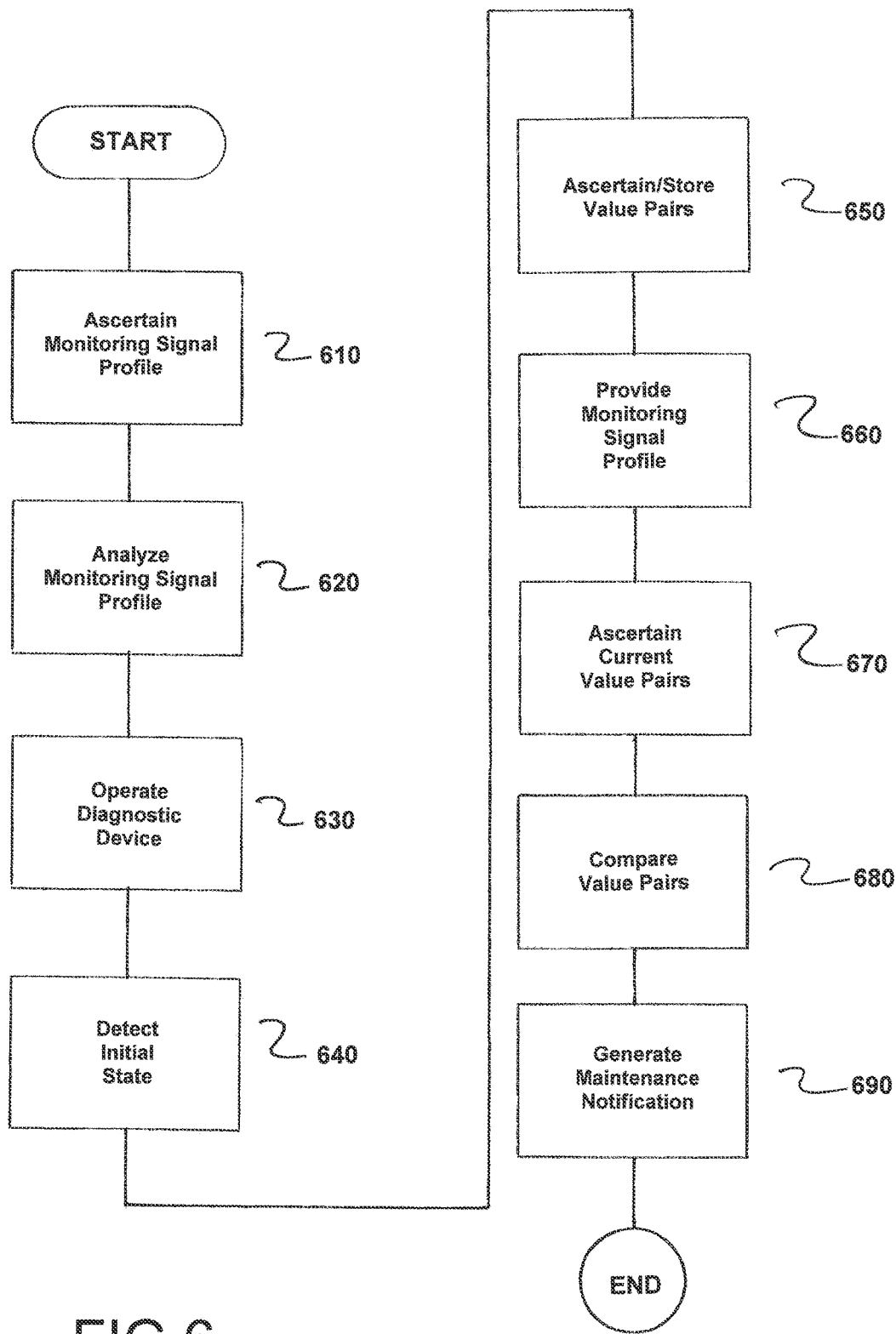
FIG. 6 is a flowchart of the method in accordance with the invention.

FIG. 6 is a flowchart of the method for operating an output module 1 in which a switch 2 switches a switching voltage UA to an output A1 for switching a load L to causes a load current $I_L$ to flow.

The method comprises ascertaining a monitoring signal profile $S_i$ which maps a signal profile of the load current $I_L$ based on the switching voltage UA, as indicated in step 610.

Next, the monitoring signal profile $S_i$ is analyzed such that the monitoring signal profile $S_i$ is compared, at least at points, with a switch-on characteristic curve K1 characterizing the load L, as indicated in step 620.

Next, the diagnostic device 5 is operated to generate a maintenance notification 7 if the comparison exceeds a specifiable deviation, as indicated in step 630.

Next, on initial startup of the load L, a detector 6 detects an initial state and thus an individual switch-on characteristic curve $K_{real}$ of the load L over a predetermined detection period $T_E$ at a predetermined sampling rate, as indicated in step 640.

Next, for the point-by-point comparison, value pairs $U_k$, $t_k$ at which a gradient m changes sign or is equal to zero in the course of the individual switch-on characteristic curve $K_{real}$ from the individual switch-on characteristic curve $K_{real}$ are ascertained and stored, as indicated in step 650. Here, the value pairs $U_k$, $t_k$ have an amplitude $U_k$ and a point in time $t_k$.

Next, the measuring device 3 provides the monitoring signal profile $S_i$ in the predetermined detection period $T_E$ at the predetermined sampling rate, as indicated in step 660.

Next, for the point-by-point comparison, current value pairs $U_1$, $t_1$ at which a gradient m changes sign or is equal to zero over a course of the monitoring signal profile $S_i$ are ascertained from the monitoring signal profile $S_i$, as indicated in step 670.

The value pairs $U_k$, $t_k$ from the individual switch-on characteristic curve $K_{real}$ are then compared with the current value pairs $U_1$, $t_1$ with respect to a shift in their point in time, as indicated in step 680.

The maintenance notification 7 is now generated if a specifiable deviation is exceeded, as indicated in step 690.

Thus, while there have been shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. An output module having an output for switching a load, the output module comprising:
   a switch which switches a switching voltage to the output to causes a load current to flow from the output through the load;
   a measuring device which provides a monitoring signal profile which maps a signal profile of the load current based on the switching voltage;
   an analyzer which compares, at least at points, the monitoring signal profile with a switch-on characteristic curve characterizing the load;

a diagnostic device which generates a maintenance notification if the comparison exceeds a specifiable deviation;

a detector which, on initial startup of the load, detects an initial state and thus an individual switch-on characteristic curve of the load over a predetermined detection period at a predetermined sampling rate, the detector additionally, for a point-by-point comparison, ascertaining and storing value pairs from the individual switch-on characteristic curve at which a gradient changes sign or is equal to zero over a course of the individual switch-on characteristic curve, the value pairs having an amplitude and a point in time, wherein the measuring device provides the monitoring signal profile in the predetermined detection period at the predetermined sampling rate;

wherein the analyzer is configured, for the point-by-point comparison, to ascertain current value pairs from the monitoring signal profile at which a gradient changes sign or is equal to zero over the course of the monitoring signal profile; and wherein the analyzer is additionally configure to examine the value pairs with the current value pairs with respect to a shift in their point in time and to generate the maintenance notification if a specifiable deviation is exceeded.

2. The output module as claimed in claim 1, wherein the analyzer is further configured to ascertain a level of a supply voltage of the output module and, when comparing the monitoring signal profile with the switch-on characteristic curve, to take account of the level of the supply voltage such that, in an event of fluctuations in the supply voltage which affect the switching voltage and thus the monitoring signal profile, no erroneously generated maintenance notification occurs.

3. The output module as claimed in claim 1, wherein the analyzer is configured, in relation to an inductive load of an electromechanical actuator with a coil and an armature, to ascertain the following values in the monitoring signal profile, starting from a starting point in time at which energization of the coil begins, a first comparison value is ascertained when a first point in time is reached at which the armature moves, a second comparison value is ascertained when a second point in time is reached at which the armature reaches an end position and a third comparison value is ascertained when a third point in time is reached at which magnetic saturation is reached.

4. The output module as claimed in claim 2, wherein the analyzer is configured, in relation to an inductive load of an electromechanical actuator with a coil and an armature, to ascertain the following values in the monitoring signal profile, starting from a starting point in time at which energization of the coil begins, a first comparison value is ascertained when a first point in time is reached at which the armature moves, a second comparison value is ascertained when a second point in time is reached at which the armature reaches an end position and a third comparison value is ascertained when a third point in time is reached at which magnetic saturation is reached.

5. The output module as claimed in claim 3, wherein the analyzer is further configured to ascertain a duration between the first point in time and the second point in time and to evaluate the duration as a wear criterion and to generate a maintenance notification if the duration exceeds a specifiable duration.

6. The output module as claimed in claim 1, further comprising:

a buffer memory for storing monitoring signal profiles and forwarding said monitoring signal profiles to a higher-level system.

7. The output module as claimed in claim 1, further comprising:

a filter for calculating a smoothed signal profile if the monitoring signal profile is present as a pulsed signal profile.

8. A method for operating an output module in which a switch switches a switching voltage to an output for switching a load to causes a load current to flow, the method comprising:

ascertaining a monitoring signal profile which maps a signal profile of the load current based on the switching voltage;

analyzing the monitoring signal profile such that the monitoring signal profile is compared, at least at points, with a switch-on characteristic curve characterizing the load;

operating a diagnostic device to generate a maintenance notification if the comparison exceeds a specifiable deviation;

detecting, by a detector on initial startup of the load, an initial state and thus an individual switch-on characteristic curve of the load over a predetermined detection period at a predetermined sampling rate;

ascertaining and storing, for the point-by-point comparison, value pairs at which a gradient changes sign or is equal to zero in the course of the individual switch-on characteristic curve from the individual switch-on characteristic curve; said value pairs having an amplitude and a point in time, providing, by the measuring device, the monitoring signal profile in the predetermined detection period at the predetermined sampling rate;

ascertaining from the monitoring signal profile, for the point-by-point comparison, current value pairs at which a gradient changes sign or is equal to zero over a course of the monitoring signal profile;

comparing the value pairs from the individual switch-on characteristic curve with the current value pairs with respect to a shift in their point in time; and generating the maintenance notification if a specifiable deviation is exceeded.

9. The method as claimed in claim 8, wherein the analyzer is operated to ascertain a level of a supply voltage of the output module and, when comparing the monitoring signal profile with the switch-on characteristic curve, to take account of the level of the supply voltage such that, in an event of fluctuations in the supply voltage, which affect the switching voltage and thus the monitoring signal profile, no erroneously generated maintenance notification occurs.

10. The method as claimed in claim 8, wherein, in an event of an inductive load of an electromechanical actuator with a coil and an armature, the following values are ascertained in the monitoring signal profile, starting from a starting point in time, at which energization of the coil begins, a first comparison value is ascertained when a first point in time is reached at which the armature moves, a second comparison value is ascertained when a second point in time is reached at which the armature reaches an end position and a third comparison value is ascertained when a third point in time is reached at which magnetic saturation is reached.

11. The method as claimed in claim 9, wherein, in an event of an inductive load of an electromechanical actuator with a coil and an armature, the following values are ascertained in the monitoring signal profile, starting from a starting point in time, at which energization of the coil begins, a first comparison value is ascertained when a first point in time is reached at which the armature moves, a second comparison value is ascertained when a second point in time is reached at which the armature reaches an end position and a third comparison value is ascertained when a third point in time is reached at which magnetic saturation is reached.

12. The method as claimed in claim 10, wherein a duration between the first point in time and the second point in time is ascertained and evaluated as a wear criterion, and a maintenance notification is generated if the duration exceeds a specifiable duration.

13. The method as claimed in claim 9, wherein the monitoring signal profiles are buffered on the output module and routed to a higher-level system.

14. The method as claimed in claim 10, wherein the monitoring signal profiles are buffered on the output module and routed to a higher-level system.

15. The method as claimed in claim 12, wherein the monitoring signal profiles are buffered on the output module and routed to a higher-level system.

* * * * *